United States Patent
Suguro

(10) Patent No.: US 8,743,601 B2
(45) Date of Patent: Jun. 3, 2014

(54) NON VOLATILE SEMICONDUCTOR MEMORY DEVICE AND MANUFACTURING METHOD THEREOF

(75) Inventor: Kyoichi Suguro, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 133 days.

(21) Appl. No.: 13/408,336

(22) Filed: Feb. 29, 2012

(65) Prior Publication Data

US 2012/0287709 A1    Nov. 15, 2012

(30) Foreign Application Priority Data

May 13, 2011  (JP) .................................. 2011-108500

(51) Int. Cl.
 *G11C 11/14* (2006.01)
 *G11C 11/16* (2006.01)

(52) U.S. Cl.
 CPC ..................................... *G11C 11/16* (2013.01)
 USPC .......................................... 365/171; 365/148

(58) Field of Classification Search
 CPC ................................. G11C 11/16; G11C 11/15
 USPC .......................................... 365/171, 173, 148
 See application file for complete search history.

(56) References Cited

U.S. PATENT DOCUMENTS

| | | | | |
|---|---|---|---|---|
| 5,702,968 | A | * | 12/1997 | Chen .............................. 438/253 |
| 6,608,383 | B2 | * | 8/2003 | Yokoyama et al. ............ 257/761 |
| 2009/0278150 | A1 | * | 11/2009 | Lee et al. ......................... 257/98 |
| 2010/0172170 | A1 | * | 7/2010 | Tamai et al. ................... 365/148 |
| 2011/0147694 | A1 | * | 6/2011 | Song et al. ........................ 257/3 |
| 2012/0268980 | A1 | * | 10/2012 | Awaya et al. .................. 365/148 |

FOREIGN PATENT DOCUMENTS

JP          4115998          4/2008

* cited by examiner

*Primary Examiner* — Huan Hoang
(74) *Attorney, Agent, or Firm* — Oblon, Spivak, McClelland, Maier & Neustadt, L.L.P.

(57) ABSTRACT

In accordance with an embodiment, a non volatile semiconductor memory device includes a substrate, a first electrode, a functional film, and a second electrode. The first electrode is provided on the substrate. The functional film is located on the first electrode and serves as a storage medium. The second electrode is provided on the functional film or in the functional film, and has a convex curved upper surface.

33 Claims, 12 Drawing Sheets

NON VOLATILE SEMICONDUCTOR MEMORY DEVICE AND MANUFACTURING METHOD THEREOF

CROSS REFERENCE TO RELATED APPLICATIONS

This application is based upon and claims the benefit of priority from the prior Japanese Patent Application No. 2011-108500, filed on May 13, 2011, the entire contents of which are incorporated herein by reference.

FIELD

Embodiments described herein relate generally to a non volatile semiconductor memory device and a manufacturing method thereof.

BACKGROUND

Along with the increase of products that use semiconductor memories, a further increase in their storage capacities is demanded.

However, due to element miniaturization, if the storage capacities are increased, a short-wavelength expensive light source, for example, has to be used, and manufacturing costs are increased.

A MEMS probe-type memory is known as a memory that does not utilize the element miniaturization. However, one problem is that when a monocrystalline ferroelectric film is used as a functional film, each memory cell is increased in size. Another problem is that when a resistance change film is used instead of the ferroelectric film, a contact failure is caused between a probe and the functional film, and thus reliability decreases.

DETAILED DESCRIPTION

In accordance with an embodiment, a non volatile semiconductor memory device includes a substrate, a first electrode, a functional film, and a second electrode. The first electrode is provided on the substrate. The functional film is located on the first electrode and serves as a storage medium. The second electrode is provided on the functional film or in the functional film, and has a convex curved upper surface.

Embodiments will now be explained with reference to the accompanying drawings. Like parts are given like reference numbers throughout the drawings and repeated explanations are omitted accordingly.

(A) MEMS Probe Memory that Uses Resistance Change Film as Storage Medium

(1) Memory Device

Figure 1:
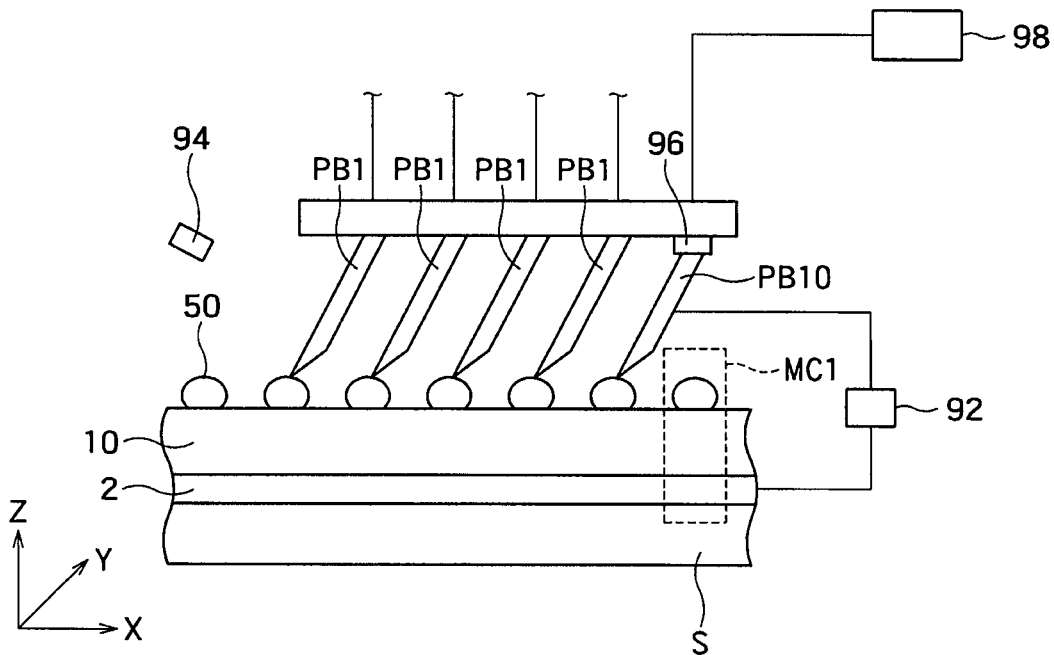
FIG. 1 is a diagram showing a general configuration of a contact type non volatile semiconductor memory device according to Embodiment 1.

FIG. 1 is a diagram showing a general configuration of a memory device according to Embodiment 1. The memory device shown in FIG. 1 is a contact type MEMS probe memory. The memory device comprises a silicon substrate S, a lower electrode 2, a resistance change film 10, an upper electrode 50, a plurality of information writing/erasing/reading probes PB1, a variable voltage source 92, a position sensor 94, a pressure sensor 96, and a probe moving unit 98 movable in X-, Y-, and Z-directions. The pressure sensor 96 detects pressure by an independent probe PB10 so as to produce proper contact pressure when the probes PB1 contact the silicon substrate S equipped with the resistance change film 10 having the upper electrodes 50.

In the present embodiment, the silicon substrate S corresponds to, for example, the substrate. The substrate is not exclusively the silicon substrate as in the following embodiments. For example, a glass substrate or a ceramic substrate may be used instead.

The lower electrode 2 is made of a metal in which an oxide thereof is also conductive, for example, an Ru electrode film. In the present embodiment, the lower electrode 2 corresponds to, for example, the first electrode.

In the present embodiment, the resistance change film 10 and the upper electrode 50 correspond to, for example, the functional film serving as the storage medium, and the second electrode, respectively. The resistance change film 10 and the upper electrode 50 are respectively made of a combination of a metal that is easy to oxidize and a metal that is difficult to oxidize. The metal for the upper electrode 50 is higher in the amount of a Gibbs free energy decrease than the metal for the functional film 10, and the metal for the functional film 10 is lower in the amount of a Gibbs free energy decrease than that of the metal for the upper electrode 50.

More specifically, the resistance change film 10 is made of an oxide film of a transition metal that changes in conductivity with oxygen concentration, such as vanadium (V), niobium (Nb), tantalum (Ta), chromium (Cr), molybdenum (Mo), or tungsten (W). The upper electrode 50 is made of a metal an oxide of which is also conductive, such as ruthenium (Ru), rhodium (Rh), platinum (Pt), iridium (Ir), or osmium (Os), or an alloy of these substances.

One characteristic of the upper electrode 50 is that this electrode comprises an electrode film pattern having a convex curved upper surface that is about 2 nm to about 20 nm in diameter, for example, a semispherical electrode film pattern having a flat bottom surface.

Figure 2:
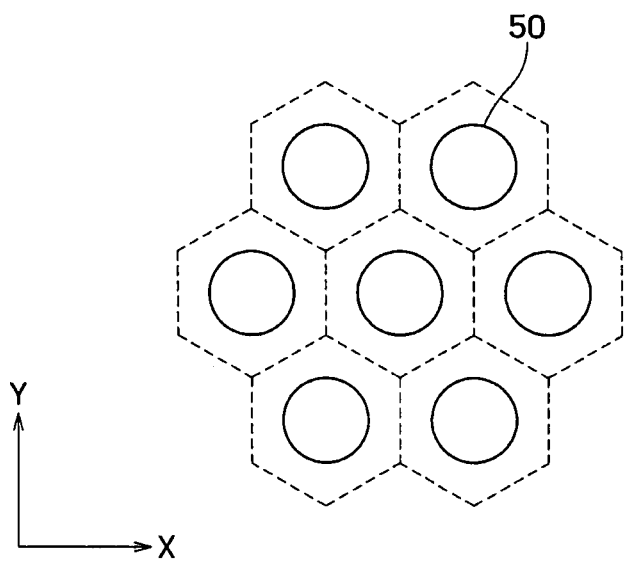
FIG. 2 is a partial plan view showing upper electrodes in FIG. 1.

FIG. 2 is a plan view showing the arrangement of the upper electrodes 50. In the present embodiment, the upper electrodes 50 are arranged in honeycomb form.

Returning to FIG. 1, the upper electrode 50, and the regions of the resistance change film 10 and the lower electrode immediately under the upper electrode 50 constitute a memory cell (minimum unit non volatile semiconductor memory device) MC1.

The probes PB1 are multiprobes arrayed in the X-direction and the Y-direction (see FIG. 2). The probes PB1 and the lower electrode 2 are both connected to the variable voltage source 92. During writing/erasing, a positive voltage is applied to the probes PB1 from the variable voltage source 92 so that oxygen ions O— move from the resistance change film 10 to the upper electrode 50. Thus, the resistance is decreased, and "1" is written. On the other hand, if a negative voltage is applied so that oxygen ions O— move from the upper electrode 50 to the resistance change film 10, the resistance is increased and "0" is written.

In the present embodiment, each of the writing, erasing, and reading operations are performed by the quantity unit of the probes PB1 arranged in a single array, and are performed when the probe moving unit 98 causes the probes PB1 to scan an XY two-dimensional plane. Each of the probes PB1 is connected to a sense amplifier and row/column decoders that are not shown. In the present embodiment, a voltage of 1 V to 3 V is applied during writing/erasing, and a voltage of 1 V to 2 V is applied during reading.

In accordance with the present embodiment, the upper electrode 50 is substantially semispherically shaped. Therefore, the scanning with the multiprobes PB1 is smoother than when the upper electrode 50 is formed, for example, by a rectangular convex pattern.

In order to optimize contact pressure between each of the probes PB1 and the upper electrode 50, the height (position in the Z-direction) of the top face of the upper electrode 50 is monitored by the position sensor 94, and the contact pressure between the probe PB1 and the upper electrode 50 is monitored by the pressure sensor 96. In accordance with the detection results, the probe moving unit 98 adjusts the height of each of the probes PB1.

Figure 3A:
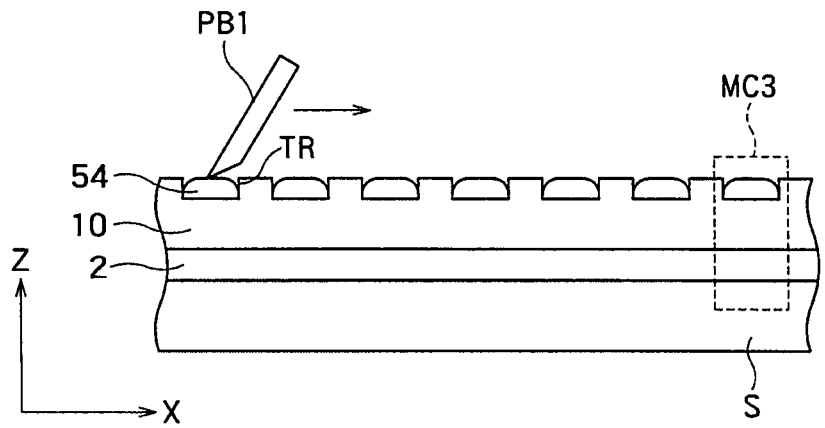
FIG. 3A is a first schematic sectional view showing a modification of the memory device in FIG. 1.
Figure 3B:
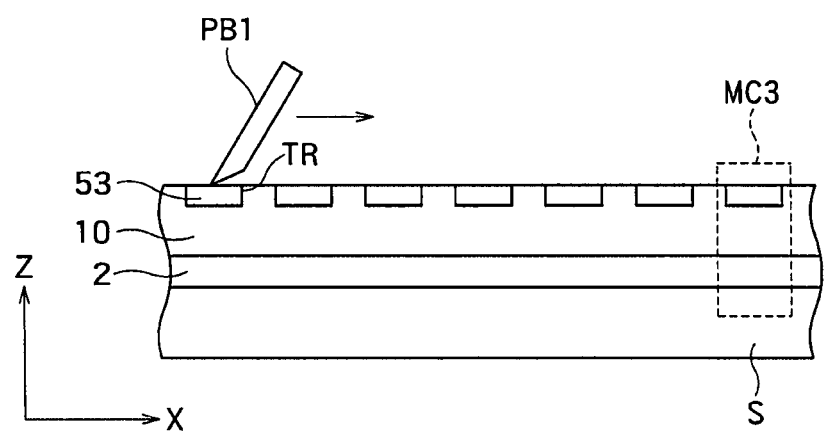
FIG. 3B is a second schematic sectional view showing a modification of the memory device in FIG. 1.
Figure 3C:
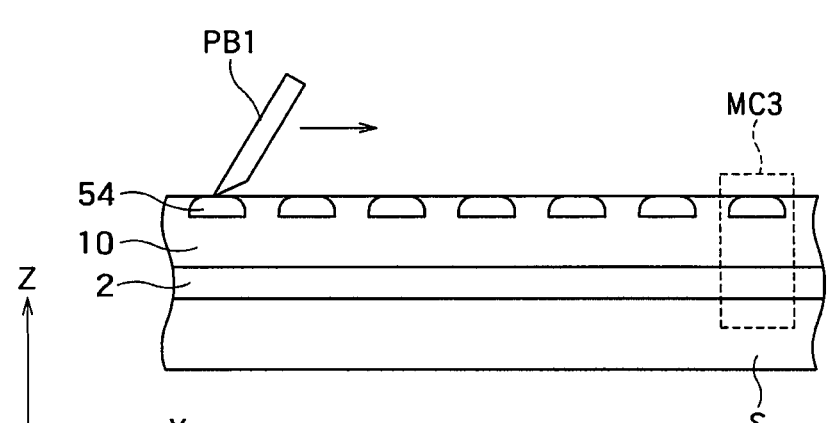
FIG. 3C is a third schematic sectional view showing a modification of the memory device in FIG. 1.

Some modifications of the present embodiment are shown in schematic sectional views of FIGS. 3A-3C. In FIGS. 3A-3C, a minimum unit memory cell MC3 is indicated by a broken line, respectively.

In a first modification shown in FIG. 3A, an upper electrode 54 is formed in a manner that a trench TR in the surface of the resistance change film 10 is filled with the upper electrode 54. Thus, the top surface of the upper electrode 54 is substantially flush with the top face of the resistance change film 10. Therefore, the scanning with the probes PB1 is easier than in the embodiment shown in FIG. 1. It is to be noted that in the present specification, the term "substantially" is used to cover "rounding" in a contour shape of an element due to a manufacturing process thereof.

In a second modification shown in FIG. 3B, an upper electrode 53 is formed in a manner that the trench TR in the surface of the resistance change film 10 is completely filled with the upper electrode 53. Thus, the top surface of the upper electrode 53 is flush with the top face of the resistance change film 10. Therefore, the scanning with the probes PB1 is much easier than in the embodiment shown in FIG. 1.

In a third modification shown in FIG. 3C, an upper electrode 54 is formed in a manner that the peripheral rounded portion Is covered by the resistance change film 10. Thus, the top surface of the upper electrode 54 is flush with the top face of the resistance change film 10. Therefore, the scanning with the probes PB1 is much easier than in the embodiment shown in FIG. 1

In accordance with the noncontact type non volatile semiconductor memories in Embodiment 1 and its modification described above, the upper electrode 50 is made of a metal an oxide of which is also conductive or made of an alloy thereof, and the probe PB1 contacts a substantially semispherical conductor. Therefore, even in a memory cell in which "0" is written, the resistivity is low, so that writing, erasing, and reading can be performed with a small contact area and with low contact resistance.

Figure 6:
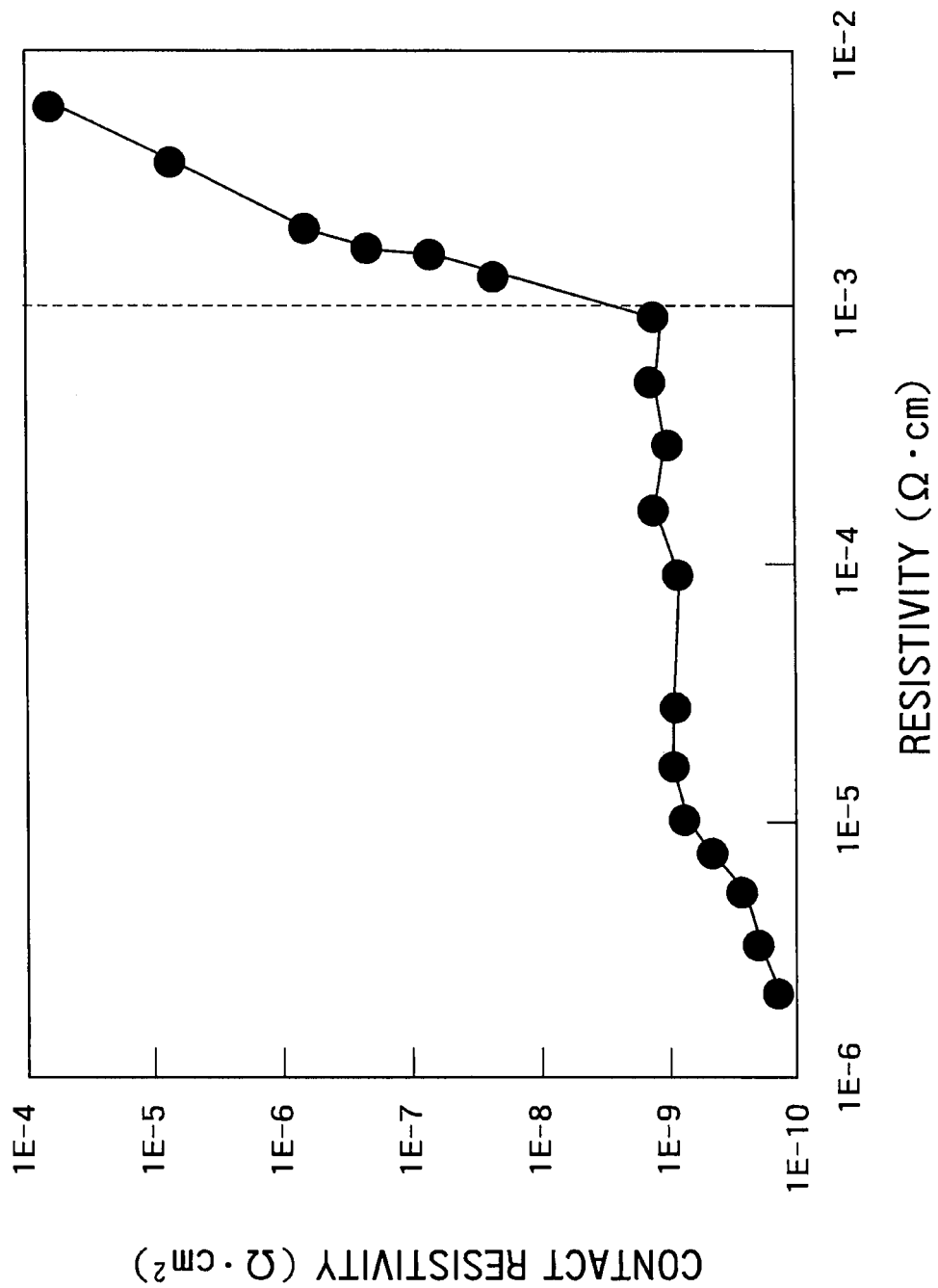
FIG. 6 is a graph showing the relation between the resistivity of the upper electrode and the contact resistivity of the upper electrode.

FIG. 6 is a graph showing the relation between the resistivity of the upper electrode and the contact resistivity of the upper electrode in Embodiment 1 and its modification. As shown in FIG. 6, the resistivity of the upper electrode 50 is $1 \times 10^{-3}$ Ω·cm or less, and the resistivity of contact between the upper electrode 50 and the probe PB1 is $10^{-9}$ Ω·cm$^2$ or less, leading to a reduced characteristic variation. Thus, a non volatile semiconductor memory device that permits writing, erasing, and reading with high reliability is provided.

(2) Memory Device Manufacturing Method (a) Embodiment 1

A method of manufacturing the non volatile semiconductor memory device shown in FIG. 1 to FIG. 3C is described as a method of manufacturing the non volatile semiconductor memory device according to Embodiment 1.

Figure 4A:
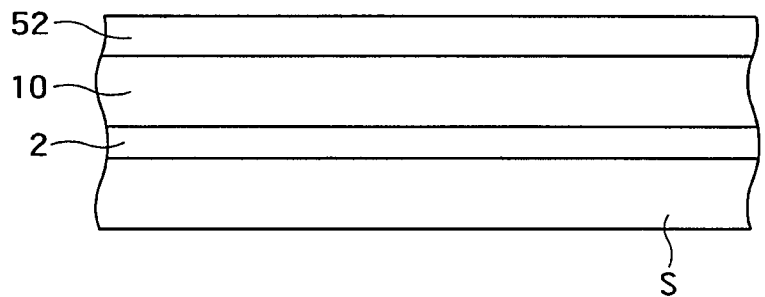
FIGS. 4A to 4D are explanatory views of a method of manufacturing a non volatile semiconductor memory device according to Embodiment 1.
Figure 4B:
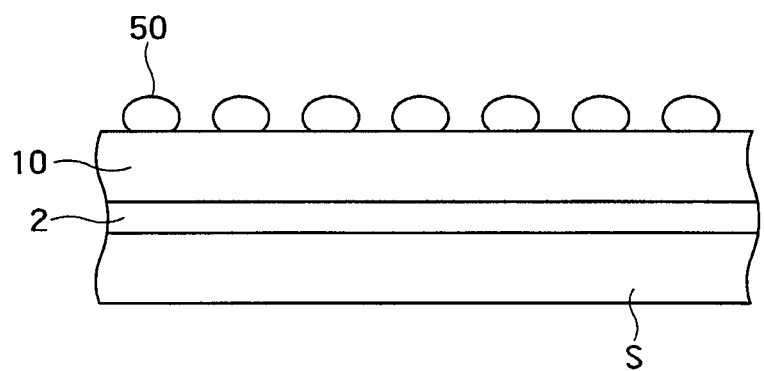

FIG. 4A and FIG. 4B are schematic sectional views for explaining the method of manufacturing the non volatile semiconductor memory device shown in FIG. 1 and FIG. 2.

First, a lower electrode 2 and a resistance change film 10 are sequentially stacked and formed on a silicon substrate S.

At the same time, the surface of the resistance change film 10 is preferably terminated with a hydroxyl group (OH) or hydrogen (H) or fluorine (F).

As shown in FIG. 4A, a film 52 made of a metal an oxide of which is also conductive, such as ruthenium (Ru), rhodium (Rh), platinum (Pt), iridium (Ir), or osmium (Os), or an alloy of these substances is then formed on the resistance change film 10 so as to have a thickness of about 1 nm to about 20 nm.

A stack of the silicon substrate S, the lower electrode 2, the resistance change film 10, and the metal film or its alloy film 52 is then put in a vacuum treatment unit (not shown). A mixed gas in which hydrogen (H2) or fluorine (F) or molecules including at least one of these substances are diluted with an inert gas or nitrogen (N2) is introduced into the vacuum unit. Plasma is then formed by heating with radio-frequency microwaves or microwaves having a frequency of 5 GHz or more or by electron cyclotron resonance (ECR). Thus, a heat treatment is conducted so that the temperature of the substrate will be about 100° C. to about 300° C. As a result, the metal film or its alloy film 52 agglomerates and forms a semispherical metal film pattern having a diameter of about 2 nm to about 20 nm, and becomes an upper electrode 50 at the room temperature. The metal films or alloy films 52 agglomerate at substantially equal intervals. Thus, the upper electrodes 50 are arranged in honeycomb form as shown in FIG. 2. A similar agglomeration phenomenon and effects are also found when heating is conducted at about 100° C. to about 300° C. by applying, instead of plasma, electromagnetic waves (about 500 W to about 1000 W) having a frequency of 5.8 GHz or more in a mixed gas in which hydrogen (H2) or fluorine (F) or molecules including at least one of these substances are diluted with an inert gas or nitrogen (N2). If a metal remains at the border between the agglomerated equally spaced patterns, an electric short circuit between the equally spaced patterns is prevented by etching removal.

Figure 4C:
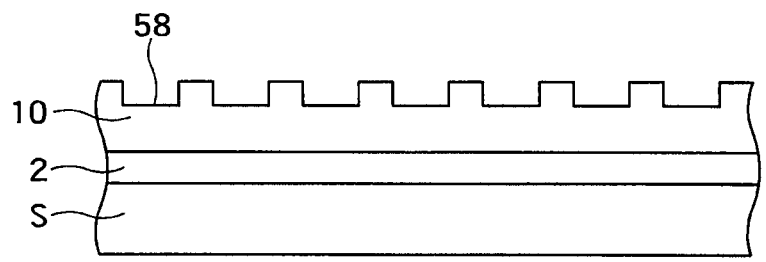
Figure 4D:
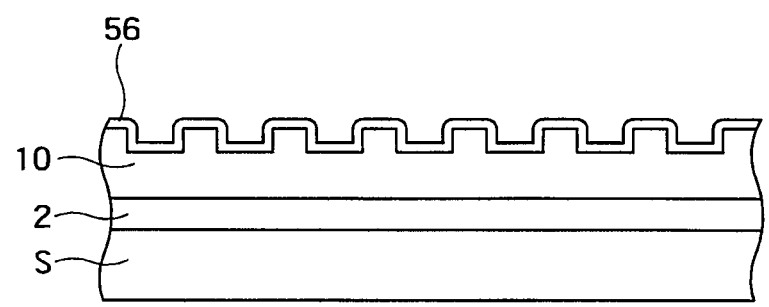

FIG. 4C and FIG. 4D are schematic sectional views for explaining the method of manufacturing the non volatile semiconductor memory device shown in FIGS. 3A to 3C.

First, a lower electrode 2 and a resistance change film 10 are sequentially stacked and formed on a silicon substrate S.

As shown in FIG. 4C, cylindrical hole patterns 58 having a depth of about 10 nm or less and a diameter of about 20 nm or less are then formed in the resistance change film 10 by etching. Further, as shown in FIG. 4D, a metal film or its alloy film 56 having a thickness of about 1 nm to about 20 nm is formed and then put in the vacuum unit.

Furthermore, a mixed gas in which hydrogen (H2) or fluorine (F) or molecules Including at least one of these substances are diluted with an inert gas or nitrogen (N2) is Introduced into the vacuum unit. Plasma is then formed by heating with radio-frequency (RF) microwaves or microwaves having a frequency of 50 GHz or more or by their electromagnetic waves or electron cyclotron resonance (ECR). Thus, a heat treatment is conducted so that the temperature of the substrate will be about 100° C. to about 300° C. As a result, the metal or its alloy constituting the film 56 agglomerates in the hole patterns 58, and upper electrodes 54 having flat upper surfaces are formed as shown in FIG. 3A except for the peripheral rounding portion thereof.

In succession to the process mentioned above, when the resistance change film 10 is further formed all over the substrate and is then removed until the upper surface of the upper electrode 54 is exposed by, for example, a chemical mechanical polishing (CMP), it is possible to obtain the non volatile semiconductor memory device shown in FIG. 3C.

Alternatively, when the materials of the resistance change film 10 and the metal film or its alloy film 56 are approximately selected in a manner that the wettability of these materials is sufficiently high for the metal film or its alloy film 56 to come to contact with all the side walls of the resistance change film 10, it is possible to obtain the non volatile semiconductor memory device shown in FIG. 3B, without further formation of the resistance change film 10.

(b) Embodiment 2

In a manufacturing method described in the present embodiment, the thickness of an upper electrode 50 is 20 nm or more. In this case, a metal film or its alloy film formed on a resistance change film 10 does not tend to agglomerate uniformly. Thus, a mixed organic material film is further formed on the metal film or its alloy film and agglomerated. For example, this film is used as a mask for etching to acquire upper electrodes arranged in honeycomb form.

FIGS. 5A to 5E are schematic sectional views for explaining the method of manufacturing the non volatile semiconductor memory device according to the present embodiment.

First, as in Embodiment 1 described above, a lower electrode 2 and a resistance change film 10 are sequentially stacked on a silicon substrate S. A film 62 made of a metal an oxide of which is also conductive, such as ruthenium (Ru), rhodium (Rh), platinum (Pt), iridium (Ir), or osmium (Os), or an alloy of these substances is formed on the resistance change film 10 so as to have a thickness of about 20 nm or more.

Figure 5A:
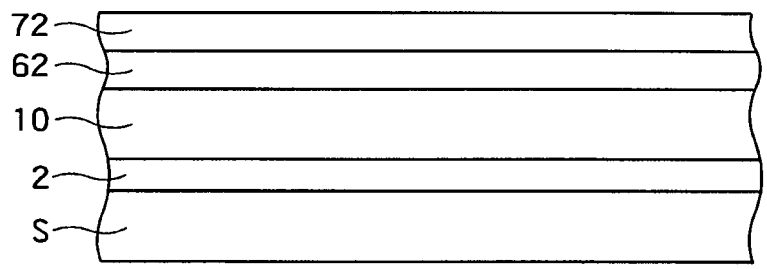
FIGS. 5A to 5E are explanatory views of a method of manufacturing a non volatile semiconductor memory device according to Embodiment 2.

A stack of the silicon substrate S, the lower electrode 2, the resistance change film 10, and the metal film or its alloy film 62 is then immersed in a solvent containing an organic material (SAM) to form a self-assembled pattern. Thus, a mixed organic material film 72 is formed as shown in FIG. 5A. In the present embodiment, a block co-polymer such as a polystyrene/polybutadiene combination or a polystyrene/polyisoprene combination is used as the material of the mixed organic material film 72.

Figure 5B:
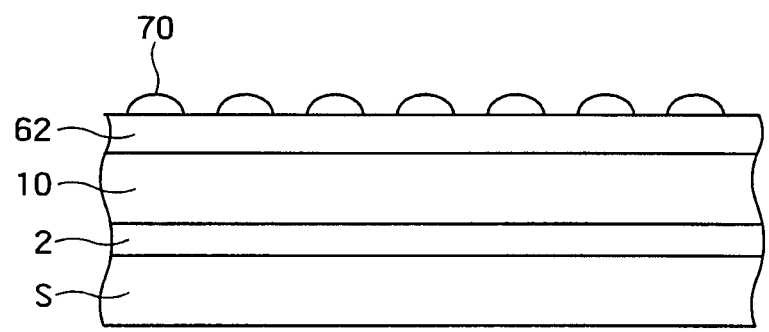

The mixed organic material film 72 is then agglomerated by hot plate heating at about 100° C. to about 200° C. or by the above-mentioned electromagnetic heating, thereby forming organic material patterns 70 in honeycomb form as shown in FIG. 5B. In the present embodiment, a structure In which a polystyrene pattern is surrounded by polybutadiene and polyisoprene is produced by the above-mentioned heating process, and this structure is treated with ozone ($O_3$). In this way, the organic material patterns 70 made of polystyrene can be only left.

Figure 5C:
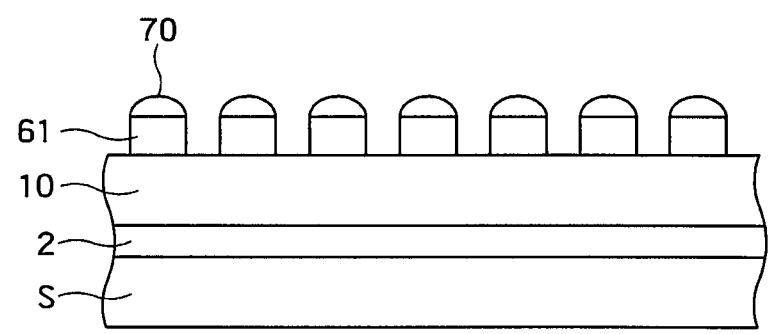
Figure 5D:
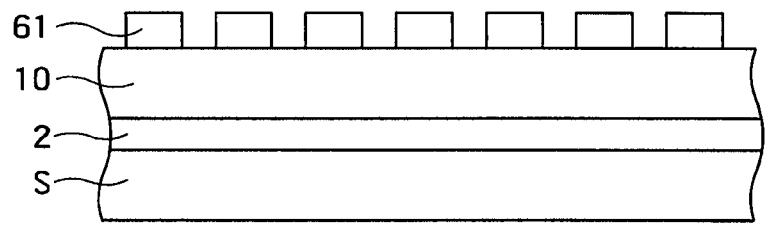
Figure 5E:
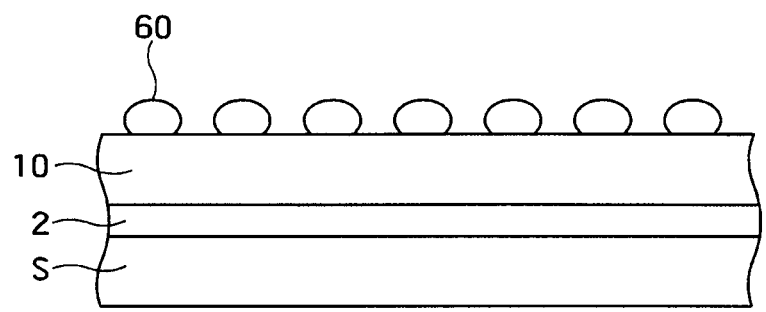

Furthermore, the organic material patterns 70 in honeycomb form are used as a mask to selectively remove the foundation metal film or its alloy film 62 by reactive ion etching, a gas cluster ion beam (GCIB), or ion milling, thereby forming electrode patterns 61 as shown in FIG. 5C. Alternatively, the organic material patterns 70 are removed by an organic solvent or by a vapor phase treatment to obtain the electrode patterns 61 as shown in FIG. 5D. Moreover, the electrode patterns 61 may be further deformed by the above-mentioned heating to have convex curved upper surfaces.

In accordance with the non volatile semiconductor memory device manufacturing method of Embodiments 1 and 2 described above, the upper electrodes 50 can be formed by using the agglomeration phenomenon without using photolithography. Thus, the non volatile semiconductor memory device can be manufactured with low manufacturing costs. Moreover, the upper electrodes 50 are arranged in honeycomb form in plan view. Therefore, an area needed for a single memory cell is $2.2 F^2$ to $2.3 F^2$ when the diameter of the upper electrode 50 is F and the distance between the upper electrodes 50 is equal to F. In contrast, when rectangular electrodes having, for example, a width F are similarly arrayed at the intervals F, an area of $4 F^2$ is needed for a single memory cell. Therefore, the degree of integration increases by $4 F^2/(2.2 F^2$ to $2.3 F^2)$.

As described above, in accordance with Embodiments 1 and 2, a reliable high-density non volatile semiconductor memory device can be manufactured with low manufacturing costs.

Figure 7:
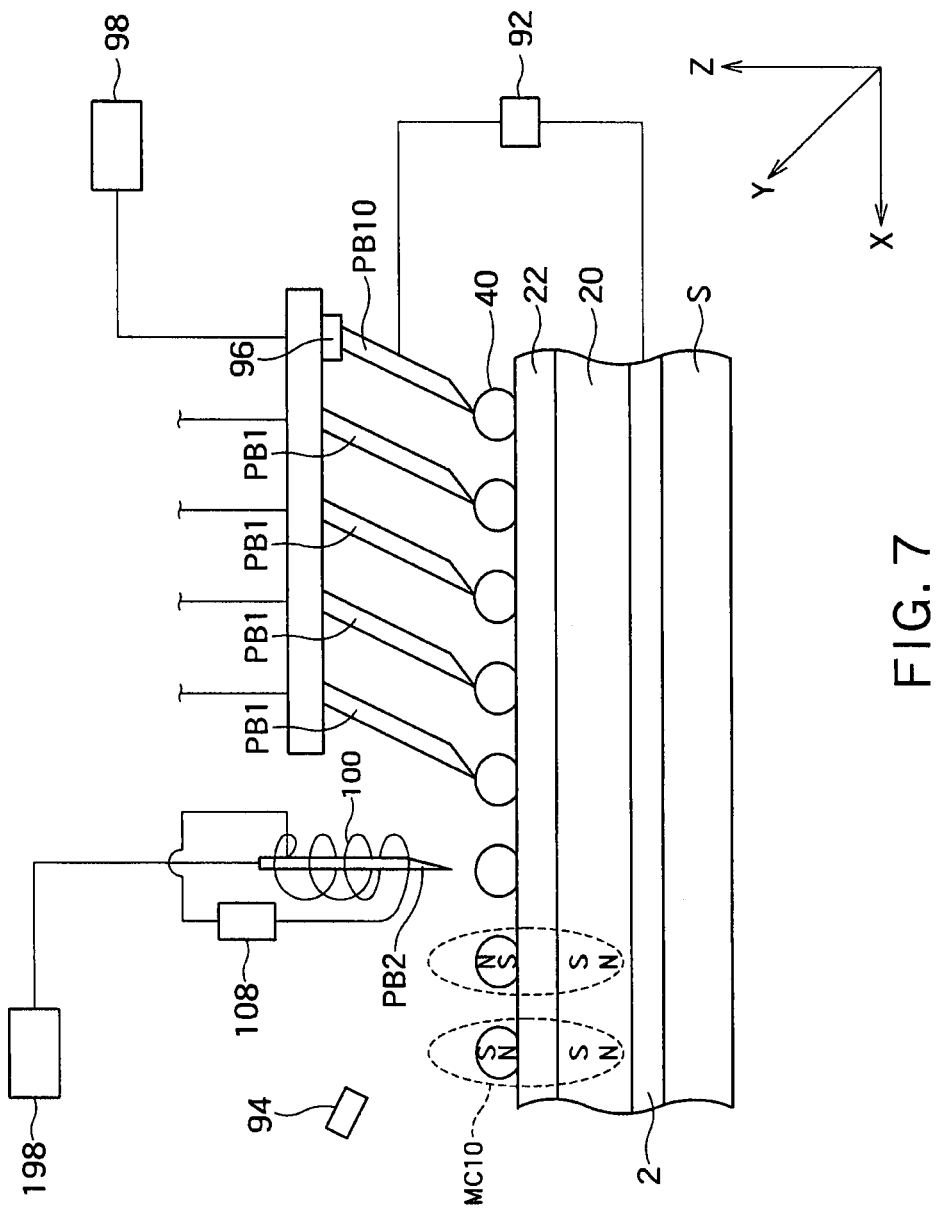
FIG. 7 is a diagram showing a general configuration of a noncontact type non volatile semiconductor memory device according to Embodiment 2.

(B) MEMS Probe Memory that Uses Magnetic Film as Storage Medium (1) Memory Device FIG. 7 is a diagram showing a general configuration of a memory device according to Embodiment 2. The memory device shown in FIG. 7 comprises a silicon substrate S, a lower electrode 2, a magnetic film 20, a metal oxide film layer 22, a magnetic electrode pattern 40, a writing/erasing probe PB2, a coil 100, a writing/erasing circuit 108, a reading multiprobe PB1, a variable voltage source 92, a position sensor 94, a pressure sensor 96, and probe moving units 98 and 198.

The magnetic film 20 is made of an amorphous CoFeB alloy film, and is a magnetic film which is previously created so as to be polarized from the positive pole to the negative pole from the side of the silicon substrate S in a direction perpendicular to the top face of the silicon substrate S (the Z-direction in FIG. 7). The magnetic film 20 functions as a reference layer.

The metal oxide film layer 22 is made of an $AL_2O_3$ film or an MgO film. The MgO film has a certain degree of crystalline orientation property from the time of its formation. The crystalline orientation property is enhanced by, for example, subsequent lamp heating, hot plate heating, or electromagnetic heating. The crystalline orientation property of the magnetic film 20 that is in contact with the metal oxide film layer 22 underneath is also enhanced. Therefore, the MgO film is preferable as the metal oxide film layer 22 to the $AL_2O_3$ film.

The magnetic electrode patterns 40 are formed on the metal oxide film layer 22, and are initially polarized from the positive pole to the negative pole from the side of the silicon substrate S in the Z-direction as is the magnetic film 20.

The writing/erasing probe PB2 is wound with the coil 100. The polarization of the magnetic electrode pattern 40 changes with the direction of a current running from the writing/erasing circuit 108. When the polarization of the magnetic electrode pattern 40 is the same as that of the underlying magnetic film 20 as a result of a writing or erasing operation, the resistance is decreased, and information "1" is recorded. When the polarization of the magnetic electrode pattern 40 is opposite to that of the magnetic film 20, the resistance is increased, and information "0" is recorded. The writing/erasing operations in the magnetic electrode pattern 40 will be described later in more detail.

(2) Manufacturing Method

Figure 8A:
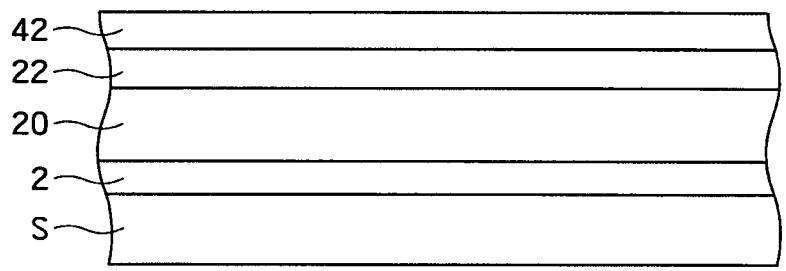
FIG. 8A and FIG. 8B are explanatory views of a method of manufacturing a non volatile semiconductor memory device according to Embodiment 3.
Figure 8B:
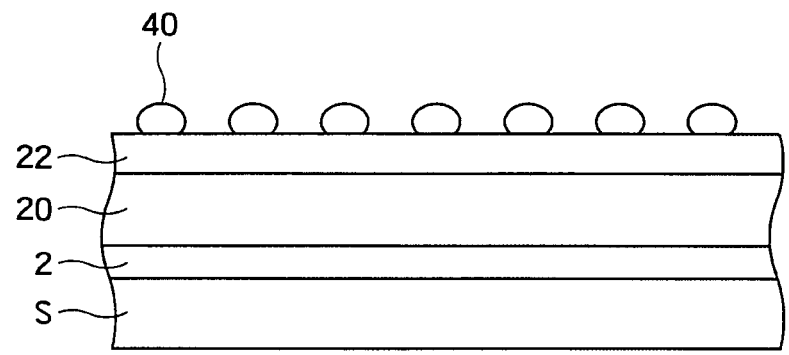

A method of manufacturing the memory device shown in FIG. 7 is described as a method of manufacturing the non volatile semiconductor memory device according to Embodiment 3 with reference to FIG. 8A and FIG. 8B.

First, as in Embodiment 1 described above, a lower electrode 2 is formed on a silicon substrate S, and then an amorphous CoFeB alloy film is formed to form a magnetic film 20. In this case, the magnetic film 20 is created so as to be polarized into the positive pole and the negative pole in a direction perpendicular to the top face of the silicon substrate S (the Z-direction in FIG. 8A). In the present embodiment, the magnetic film 20 is polarized from the positive pole to the negative pole from the side of the silicon substrate S.

An MgO film having a thickness of about 1 nm to about 2 nm is then formed on the magnetic film 20 to form a metal oxide film layer 22.

As shown in FIG. 8A, a metal film 42 containing nickel (Ni), cobalt (Co), iron (Fe), or a rare earth metal in which an electronic f-orbital is not satisfied is formed on the metal oxide film layer 22 so as to have a thickness of about 1 nm to about 10 nm before entry into the vacuum unit. A mixed gas in which hydrogen ($H_2$) or molecules including hydrogen (H) are diluted with an inert gas or nitrogen ($N_2$) is introduced into the vacuum unit. Plasma is then formed by heating with radio-frequency microwaves or microwaves having a frequency of 5 GHz or more or by their electromagnetic waves or electron cyclotron resonance (ECR). Thus, a heat treatment is conducted so that the temperature of the substrate will be about 100° C. to about 300° C. The metal film 42 is not limited to the above-mentioned materials, and may be made of any magnetic material.

Consequently, as shown in FIG. 8B, the metal film 42 agglomerates, and a semispherical metal film pattern 40 having a diameter of about 2 nm to about 20 nm is formed. The metal film patterns 40 are arranged at substantially equal intervals as shown in FIG. 2. A similar agglomeration phenomenon and effects are also found when heating is conducted at about 100° C. to about 300° C. by applying, instead of plasma, electromagnetic waves (500 W to 1000 W) having a frequency of 5.8 GHz or more in a mixed gas in which hydrogen ($H_2$) or molecules including hydrogen (H) are diluted with an inert gas or nitrogen ($N_2$).

(3) Writing/Erasing Method and Reading Method

Figure 9:
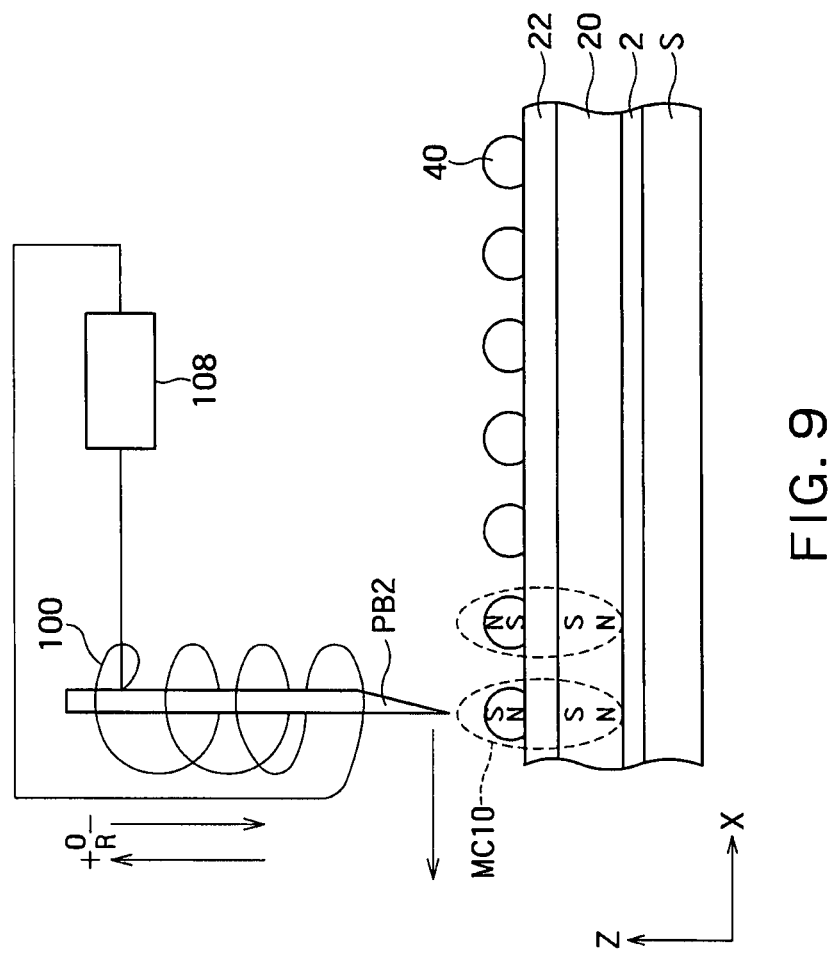
FIG. 9 is an explanatory view of a method of writing/erasing in the non volatile semiconductor memory device in FIG. 7.

As shown in FIG. 9, the writing/erasing probe PB2 is brought closer to the magnetic electrode pattern 40 of a memory cell MC10 by the probe moving unit 198, and a current in a direction corresponding to a writing signal is passed through the coil 100 from the writing/erasing circuit 108. The coil 100 is wound around the magnetic writing/erasing probe PB2. Thus, a magnetic field is generated, and the magnetic electrode pattern 40 is polarized in a direction perpendicular to the top face of the silicon substrate S (the Z-direction in FIG. 9) according to the direction of the current running through the coil 100.

For example, if the magnetic electrode pattern 40 is polarized from the positive pole to the negative pole when viewed from the silicon substrate S as in a memory cell MC10a in FIG. 9, this polarization is the same as that of the magnetic film 20. Accordingly, a current runs from the reading probe PB1 to the lower electrode 2 during reading, and information "1" is detected. In contrast, if the magnetic electrode pattern 40 is polarized from the negative pole to the positive pole when viewed from the silicon substrate S as in a memory cell MC10b, this polarization is opposite to that of the magnetic film 20. Accordingly, the resistance is increased, no current runs from the reading probe PB1 to the lower electrode 2 during reading, and information "0" is detected.

Thus, in accordance with Embodiment 2, there is provided a non volatile semiconductor memory device that permits noncontact writing and erasing.

Moreover, as in Embodiment 1 described above, the magnetic electrode pattern 40 is semispherically shaped in the non volatile semiconductor memory device according to Embodiment 2. This enables smooth scanning with the multiprobe PB1 during reading.

(C) Cross-Point Memory (1) General Structure of Memory Device

Figure 10:
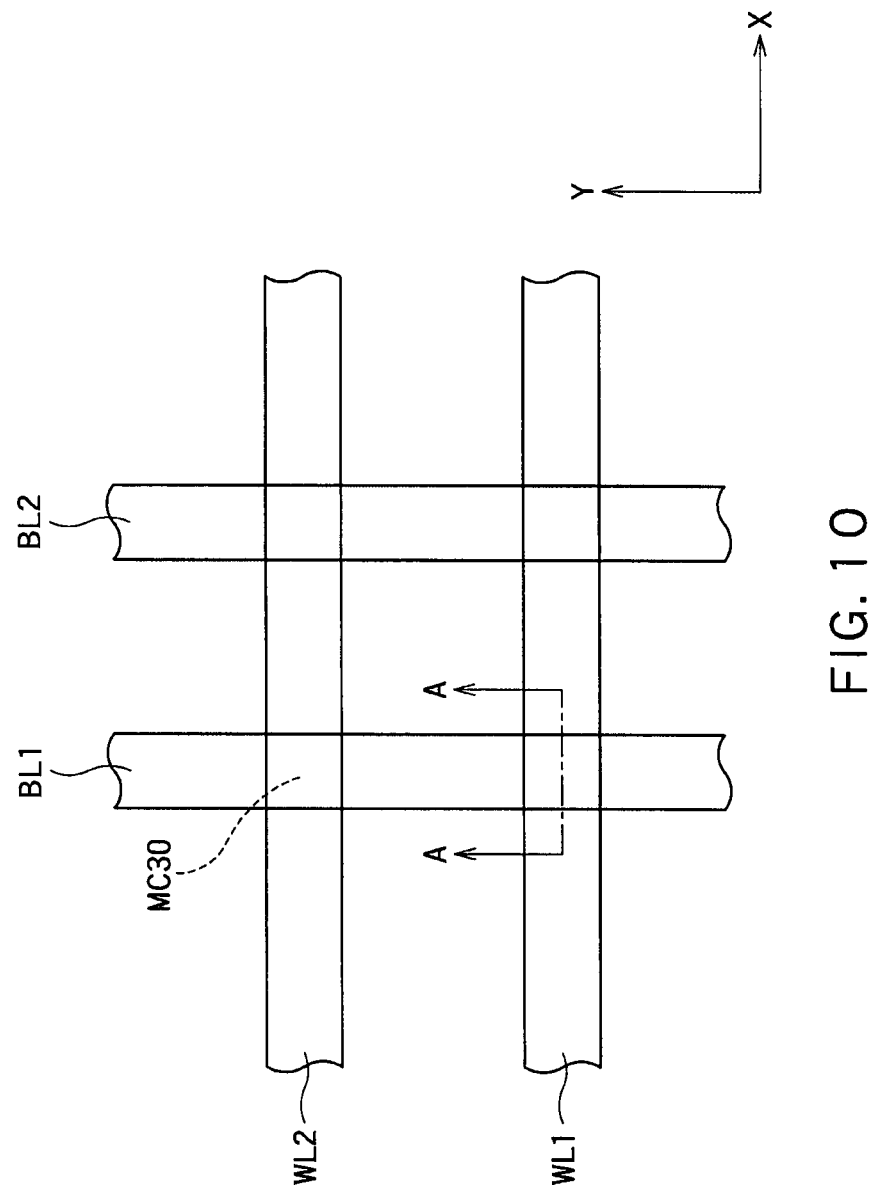
FIG. 10 is a plan view showing a general configuration of a non volatile semiconductor memory device according to Embodiment 3.
Figure 11:
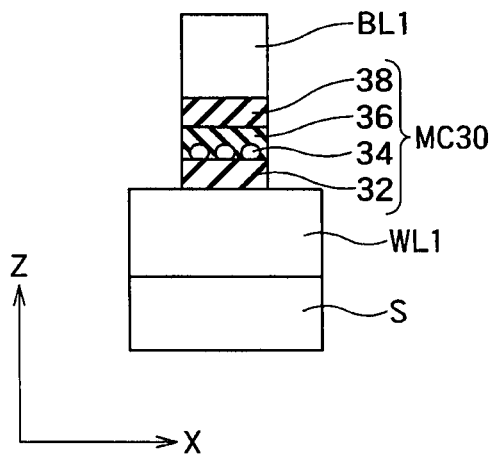
FIG. 11 is a sectional view along the line A-A of FIG. 10.

FIG. 10 is a view showing a general configuration of a memory device according to Embodiment 3. FIG. 11 is a sectional view along the line A-A of FIG. 10. The memory device shown in FIG. 10 and FIG. 11 is a cross-point memory. This memory device comprises a silicon substrate S (see FIG. 11), word lines WL1, WL2, . . . made of a conductor, bit lines BL1, BL2, . . . which are made of a conductor and which intersect with the word lines WL1, WL2, . . . , and a memory cell MC30. In the present embodiment, the word lines WL1, WL2, . . . correspond to, for example, the first electrode, and the bit lines BL1, BL2, . . . correspond to, for example, the second electrode.

The memory cell MC30 is formed on the word line WL1, WL2, . . . at the intersection of the word line WL1, WL2, . . . and the bit line BL1, BL2, . . . . As shown in FIG. 11, the memory cell MC30 comprises a structure in which first to third dielectric films 32, 36, and 38 are sequentially stacked when viewed from the side of the word line WL. In the second dielectric film 36, organic particulates 34 having convex curved upper surfaces, for example, semispherical organic particulates 34 having flat bottom surfaces are formed to serve as a charge trap film, and trap a charge to store information.

As in other cross-point memories, the position of the memory cell MC30 is also specified by a selector (not shown) in the present embodiment. When a current Is passed through the specified memory cell MC30 from a writing/erasing circuit (not shown), the organic particulates 34 in the second dielectric film 36 trap electrons to store information. The electrons are trapped by the organic particulates 34, so that when, for example, an N-type transistor (not shown) is connected to the memory cell MC30, a threshold voltage rises, and the transistor is not switched on by a normal voltage. Thus, information "0" is detected.

(2) Manufacturing Method

Figure 12A:
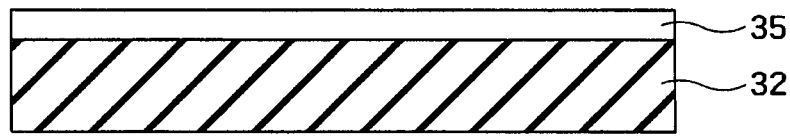
FIGS. 12A to 12C are explanatory views of a method of manufacturing a non volatile semiconductor memory device according to Embodiment 4.
Figure 12B:
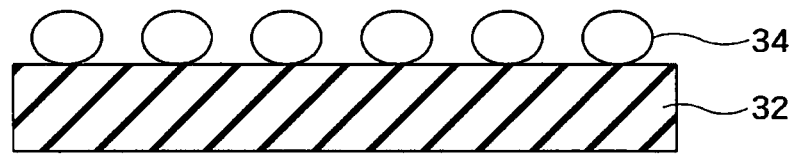
Figure 12C:
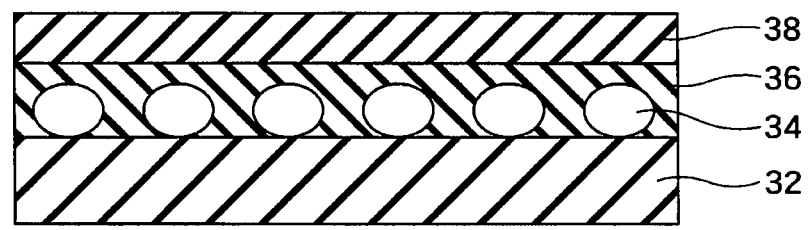

A method of manufacturing the memory device shown in FIG. 10 and FIG. 11 is described as a method of manufacturing a non volatile semiconductor memory device according to Embodiment 4 with reference to FIG. 12A to FIG. 12C.

First, word line WL1, WL2, . . . are formed on a silicon substrate S by a known method, and then an $SiO_2$ or SiON film having a thickness of about 1 nm to about 3 nm is formed to form a first dielectric film 32. Further, the surface of the first dielectric film 32 is terminated with hydrogen (H) or fluorine (F) or a hydroxyl group (OH).

As shown in FIG. 12A, a metal (molybdenum (Mo), tungsten (W), nickel (Ni), cobalt (Co), iron (Fe), lead (Pb), platinum (Pt), ruthenium (Ru), rhodium (Rh), iridium (Ir), osmium (Os), gold (Au), silver (Ag), or copper (Cu)) smaller than Si in free energy decrease amount during oxide formation or metal alloy 35 is then formed into a film having a thickness of 0.5 nm to 2 nm on the first dielectric film 32.

As shown in FIG. 12B, a heat treatment is then conducted at about 100° C. to about 300° C. in an atmosphere containing plasma or hydrogen ($H_2$) or fluorine (F) using the above-mentioned microwaves or using their electromagnetic waves or electron cyclotron resonance (ECR). The metal or alloy 35 is formed into semispherical metal or alloy patterns 34 having a diameter of 3 nm or less by an agglomeration phenomenon.

Furthermore, as shown in FIG. 12C, a second dielectric film 36 higher in nitrogen concentration or higher in dielectric constant than the first dielectric film is formed over the metal or alloy patterns 34. Moreover, on the second dielectric film 36, an $SiO_2$ film or SiON film or SiN film having a thickness of about 3 nm to about 20 nm is formed to form a third dielectric film 38.

The third dielectric film 38, the second dielectric film 36, the metal or alloy patterns 34, and the first dielectric film 32 are selectively removed by patterning that uses a photoresist to form a memory cell MC30 so that a region to be the intersection of a word line WL1, WL2, . . . and a bit line BL1, BL2, . . . remains. The bit line BL1, BL2, . . . is further formed on the memory cell MC30.

As described above, in accordance with the memory device manufacturing method of the present embodiment, a memory cell is formed at the intersection of the word line and the bit line by using the charge trap film formation method. Consequently, it is possible to provide a non volatile semiconductor memory device having a cell size of 10 nm☐ or less that permits a sufficient number of electrons to be in and out.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A non volatile semiconductor memory device comprising:
   a substrate;
   a first electrode on the substrate;
   a functional film as a storage medium on the first electrode; and
   a second electrode on or in the functional film, the second electrode having a convex curved upper surface;
   wherein the functional film and the second electrode are made of a combination of a metal having low resistance to oxidization and a metal having high resistance to oxidization.

2. The device of claim 1,
   wherein the functional film is a resistance change film.

3. The device of claim 1,
   wherein a plurality of second electrodes are arranged in honeycomb form in plan view.

4. The device of claim 1,
   wherein the functional film is formed from an oxide of a first transition metal that changes conductivity thereof depending on oxygen concentration.

5. The device of claim 1, further comprising
   a plurality of conductive probes connected to a voltage source, the conductive probes contacting the second electrode to perform writing or erasing in the functional film and reading from the functional film.

6. The device of claim 1,
   wherein the functional film is a magnetic film, and the second electrode is a dielectric electrode.

7. The device of claim 6, further comprising:
   a magnetic probe which is wound with a coil and which approaches the second electrode during writing or erasing and during reading,
   wherein writing or erasing is performed by polarizing the magnetic film in a noncontact manner in a desired mode in a direction perpendicular to the top face of the substrate according to the direction of a current running through the coil.

8. A non volatile semiconductor memory device comprising:
   a substrate;
   a first electrode on the substrate;
   a functional film as a storage medium on the first electrode; and
   a second electrode on or in the functional film, a level of the top surface of the second electrode being substantially equal to a level of the top surface of the functional film.

9. The device of claim 8,
   wherein the functional film is a resistance change film.

10. The device of claim 8,
    wherein a plurality of second electrodes are arranged in honeycomb form in plan view.

11. The device of claim 8,
wherein the functional film and the second electrode are made of a combination of a metal having low resistance to oxidization and a metal having high resistance to oxidization.

12. The device of claim 8,
wherein the functional film is formed from an oxide of a first transition metal that changes conductivity thereof depending on oxygen concentration.

13. The device of claim 8, further comprising:
a plurality of conductive probes connected to a voltage source, the conductive probes contacting the second electrode to perform writing or erasing in the functional film and reading from the functional film.

14. The device of claim 8,
wherein the functional film is a magnetic film, and the second electrode is a dielectric electrode.

15. The device of claim 14, further comprising:
a magnetic probe which is wound with a coil and which approaches the second electrode during writing or erasing and during reading,
wherein writing or erasing is performed by polarizing the magnetic film in a noncontact manner in a desired mode in a direction perpendicular to the top face of the substrate according to the direction of a current running through the coil.

16. A non volatile semiconductor memory device comprising:
a substrate;
a linear first electrode on the substrate, the longitudinal direction of the linear first electrode being a first direction;
a linear second electrode on the first electrode, the longitudinal direction of the linear second electrode being a second direction that intersects with the first direction; and
a memory cell between the first electrode and the second electrode at the intersection of the first electrode and the second electrode,
wherein the memory cell has a stack of first to third dielectric films on the first electrode, and particulates in the second dielectric film, the particulates being made of a first metal or made of an alloy of the first metal and a second metal other than the first metal, the particulates having convex curved upper surfaces, and the amount of Gibbs free energy change during oxidation of the first metal is smaller than that during oxidation of silicon.

17. The non volatile semiconductor memory device according to claim 16,
wherein an oxide of the first metal is also conductive.

18. The non volatile semiconductor memory device according to claim 16,
wherein the first metal is nickel (Ni), cobalt (Co), iron (Fe), or a rare earth metal in which an electronic f-orbital is not satisfied.

19. A method of manufacturing a non volatile semiconductor memory device, the method comprising:
forming a first electrode on a substrate;
forming, on the first electrode, a functional film serving as a storage medium;
forming, on the functional film, a metal film or its alloy film; and
using an agglomeration phenomenon resulting from a heat treatment to form a second electrode having a convex curved upper surface from the metal film or its alloy film.

20. The method of claim 19,
wherein the functional film is a resistance change film, and the metal film or its alloy film is formed by use of a metal an oxide of which is also conductive.

21. The method of claim 19,
wherein the heat treatment is conducted by use of microwaves.

22. The method of claim 19,
wherein the heat treatment comprises forming plasma.

23. The method of claim 19,
wherein the heat treatment is conducted by applying electromagnetic waves in a mixed gas in which hydrogen ($H_2$) or fluorine (F) or molecules comprising at least one of these substances are diluted with an inert gas or nitrogen ($N_2$).

24. The method of claim 19,
wherein the metal film or its alloy film is formed so as to have a thickness of about 20 nm or more,
the method further comprising forming a mixed organic material film on the metal film or its alloy film,
the second electrode being formed by agglomerating the mixed organic material film in the heat treatment and using the agglomerated mixed organic material film as a mask to selectively remove the metal film or its alloy film.

25. The method of claim 19,
wherein the functional film is a magnetic film, and
the metal film or its alloy film is formed by use of nickel (Ni), cobalt (Co), iron (Fe), or a rare earth metal in which an electronic f-orbital is not satisfied.

26. The method of claim 25,
wherein forming the metal film further comprises forming, on the functional film, a metal oxide film which has a crystalline orientation property or which comes to have a crystalline orientation property as a result of a heat treatment.

27. A method of manufacturing a non volatile semiconductor memory device, the method comprising:
forming, on a substrate, a linear first electrode which has its longitudinal direction in a first direction;
forming, on the first electrode, a linear second electrode which has its longitudinal direction in a second direction that intersects with the first direction; and
forming a memory cell between the first electrode and the second electrode at the intersection of the first electrode and the second electrode,
wherein forming the memory cell comprises;
forming a first dielectric film on the first electrode,
forming, on the first dielectric film, a metal film or metal alloy film which comprises a metal smaller than silicon in free energy decrease amount during oxide formation,
using an agglomeration phenomenon resulting from a heat treatment to form a metal film pattern having a convex curved upper surface from the metal film or metal alloy film,
forming a second dielectric film over the metal film pattern, and
forming a third dielectric film on the second dielectric film.

28. The method of claim 27,
wherein the heat treatment is conducted by use of at least one of microwaves, plasma, and an atmosphere containing hydrogen (H) or fluorine (F).

29. A non volatile semiconductor memory device comprising:
a substrate;
a first electrode on the substrate;
a functional film as a storage medium on the first electrode;

a second electrode on or in the functional film, and the second electrode having a convex curved upper surface; and a magnetic probe which is wound with a coil and which approaches the second electrode during writing or erasing and during reading;

wherein the functional film is a magnetic film, and the second electrode is a dielectric electrode, and writing or erasing is performed by polarizing the magnetic film in a noncontact manner in a desired mode in a direction perpendicular to the top face of the substrate according to the direction of a current running through the coil.

30. The device of claim 29,
wherein the functional film is a resistance change film.

31. The device of claim 29,
wherein a plurality of second electrodes are arranged in honeycomb form in plan view.

32. The device of claim 29,
wherein the functional film is formed from an oxide of a first transition metal that changes conductivity thereof depending on oxygen concentration.

33. The device of claim 29, further comprising:
a plurality of conductive probes connected to a voltage source, the conductive probes contacting the second electrode to perform writing or erasing in the functional film and reading from the functional film.

* * * * *